(12) United States Patent
Windlass et al.

(10) Patent No.: US 7,396,692 B2
(45) Date of Patent: Jul. 8, 2008

(54) METHOD FOR INCREASING FERROELECTRIC CHARACTERISTICS OF POLYMER MEMORY CELLS

(75) Inventors: Hitesh Windlass, Hillsboro, OR (US); Ebrahim Andideh, Portland, OR (US); Daniel C. Diana, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 567 days.

(21) Appl. No.: 10/713,307

(22) Filed: Nov. 14, 2003

(65) Prior Publication Data

US 2005/0106760 A1  May 19, 2005

(51) Int. Cl.
*H01L 21/312* (2006.01)
*H01L 21/47* (2006.01)

(52) U.S. Cl. .......................... 438/3; 438/780

(58) Field of Classification Search ............ 438/3, 438/29, 57, 82, 780; 359/296
See application file for complete search history.

(56) References Cited

U.S. PATENT DOCUMENTS

| | | | | |
|---|---|---|---|---|
| 3,490,050 A | * | 1/1970 | Weiner | 330/4.5 |
| 5,267,224 A | * | 11/1993 | Yamazaki | 369/13.35 |
| 5,321,533 A | * | 6/1994 | Kumar | 349/86 |
| 5,880,804 A | * | 3/1999 | Yamaguchi et al. | 349/188 |
| 5,952,991 A | * | 9/1999 | Akiyama | 345/98 |
| 6,407,797 B1 | * | 6/2002 | Biradar et al. | 349/187 |
| 6,757,035 B2 | * | 6/2004 | Choi et al. | 349/85 |
| 7,173,842 B2 | * | 2/2007 | Isenberger et al. | 365/145 |
| 2002/0017607 A1 | * | 2/2002 | Lehman et al. | 250/338.3 |
| 2002/0181072 A1 | * | 12/2002 | Cook | 359/296 |
| 2004/0131862 A1 | * | 7/2004 | Szmanda et al. | 428/421 |
| 2004/0171773 A1 | * | 9/2004 | Bu et al. | 526/72 |

OTHER PUBLICATIONS

Koda et al., Nematic Liquid Crystals Dispersed in a ferroelectric Copolymer of Vinylidene Fluoride and Trifluoroethylene, Jpn. J. Appl. Phys., vol. 42, (2003), pp. 4426-4430.*
Kimura et al., Orientation control of poly(vinylidenefluoride-trifluoroethylene) crystals and molecules using atomic force microscopy, Applied Physics Letters, vol. 82, No. 23, pp. 4050-4052.*

* cited by examiner

*Primary Examiner*—M. Wilczewski
(74) *Attorney, Agent, or Firm*—Blakely, Sokoloff, Taylor & Zafman LLP

(57) ABSTRACT

Methods for improving the net remnant polarization of a polymer memory cell are disclosed. In one embodiment, the polymer material is heated above the Curie temperature of the polymer material, and the domains of the polymer material are aligned with an externally applied electric field.

20 Claims, 3 Drawing Sheets

METHOD FOR INCREASING FERROELECTRIC CHARACTERISTICS OF POLYMER MEMORY CELLS

FIELD

The embodiments disclosed herein relate generally to the ferroelectric properties of polymer material.

BACKGROUND

There are many materials that have ferroelectric properties, which are indicated by the ability of a material to achieve and maintain a high degree of polarization (e.g., alignment of the atomic or molecular dipoles that comprise the material) even in the absence of an external electric field. In some materials, groups of dipoles can be similarly aligned in regions known as "domains" within the material. When a significant number of the domains of a material are aligned in the same direction, the material becomes highly polarized and can maintain a specific orientation, which can be useful for many applications.

For example, highly polarized material can be used in computer memory cells. In such an application, it is important to have a highly polarized material to prevent stray electrical voltages from reversing a value written to a memory cell by the computer system. Various methods have been used to improve the disturb resistance (e.g., ability to resist inadvertent value reversal) of the material used within the memory cell.

For example, one conventional method includes formation of the memory cell material (e.g., a polymer) on a substrate followed by formation of an electrode on top of the memory cell material. The memory cell material is then heated so that the dipoles within the domains of the material can overcome the steric hindrances and internal electrostatic forces of the material (e.g., are free to be re-aligned). During the heating process (e.g., annealing), the electrode formed on top of the memory cell material can be used to apply an electric field to the memory cell material to align the dipoles, and hence, the domains, of the memory cell material in a common direction. However, use of the electrode to apply the electric field typically results in degradation of the interface between the electrode and the memory cell material. It is believed that the degradation of the interface results from a reaction between the memory cell material and the metal of the electrode.

DESCRIPTION OF THE DRAWINGS

Various embodiments are illustrated by way of example and not by way of limitation in the figures of the accompanying drawings in which like references indicate similar elements. It should be noted that references to "an," "one," "the," "other," "another," "alternative," or "various" embodiments in this disclosure are not necessarily to the same embodiment, and such references mean at least one.

DETAILED DESCRIPTION

The following description and the accompanying drawings provide examples for the purposes of illustration. However, these examples should not be construed in a limiting sense as they are not intended to provide an exhaustive list of all possible implementations.

Figure 1:
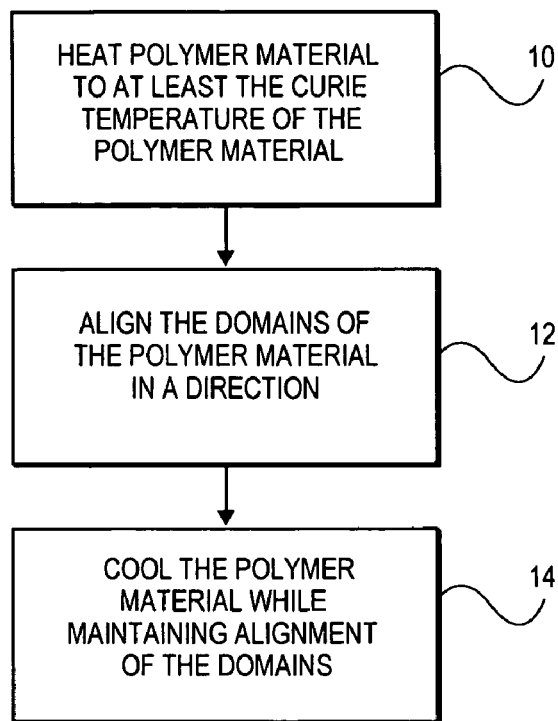
FIG. 1 is a flow chart of one embodiment of a method of aligning the domains of a polymer material in a specific direction.

Referring now to FIG. 1, a flow chart is shown detailing one embodiment of a method of aligning the domains of a polymer material. In one embodiment, the polymer material comprises poly(vinylidene fluoride-trifluoroethylene) (e.g., PVDF-TrFE).

At block 10, the polymer material, which may be formed on a substrate, is heated to a temperature at least as high as a Curie temperature of the polymer material. The Curie temperature is the temperature at which the degree of spontaneous polarization of a particular material is zero. Once the polymer material is heated above the Curie temperature, the dipoles of the polymer material are free to be aligned.

In various embodiments, heating the polymer material includes directly applying heat to the polymer material, the substrate, or both with a heating element. For example, the heating may take place in a chamber (e.g., a physical vapor deposition chamber or any other chamber capable of maintaining a vacuum during processing) that includes a heated chuck on which the substrate sits during heating and alignment of the domains of the polymer material. Heating the polymer material may also comprise creating ambient heat within the chamber, which may be performed in addition to or in place of directly applying heat with a heating element.

Regardless of the method of heating used, the heat may be applied, for example, for a period of between approximately 2 and 600 minutes and at a temperature between, for example, approximately 130 degrees and 150 degrees Celsius. The heating may be performed at a temperature and/or for a duration outside of these ranges. However, the heating is preferably performed at a temperature below the melting point of the polymer material.

At block 12, a plurality of the domains of the heated polymer material are aligned in a direction relative to a surface of the substrate. In one embodiment, aligning includes exposing the polymer material to an electric field, which may be, for example, at least approximately 40 megavolts per meter. Higher strength electric fields may be used for thinner layers of polymer material.

In various embodiments, the electric field may be induced and/or created with a device (e.g., a capacitor). With a capacitor, the electric field is created between the two plates of the capacitor. The electric field may be induced, in one embodiment, by creating a changing magnetic field between two plates.

Regardless of the mechanism used to apply the external electric field, the electric field can be applied, in one embodiment, such that the domains of the polymer material are aligned in a direction approximately perpendicular to the surface of the substrate. In embodiments in which the domains are aligned in a direction perpendicular to the surface of the substrate, the domains may point away from or towards the surface of the substrate. The alignment of the domains (e.g., exposure to the electric field) may be performed until at least approximately 75 percent of the polymer material is in a ferroelectric phase (e.g., β-phase for PVDF-TrFE).

At block 14, the polymer material is cooled while maintaining alignment of the domains of the polymer material. Preferably, alignment of the domains is maintained until the temperature of the polymer material is below the Curie temperature of the polymer material to ensure that the domains do not become randomized, or less polarized, when the electric field is removed.

Figure 2:
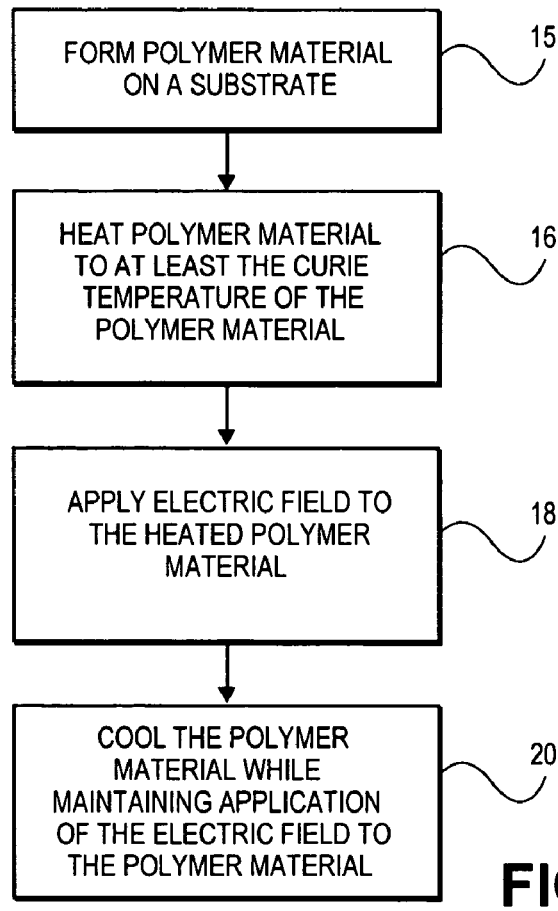
FIG. 2 is a flow chart of another embodiment of a method for applying an electric field in order to align the domains of a material.

FIG. 2 shows one embodiment of a method of applying an electric field to a polymer material to align the domains of the polymer material. At block 15, the polymer material is formed on a substrate (e.g., a semiconductor substrate). In one embodiment, the polymer material may be formed by a spin coating process. In an alternative embodiment, the formation of the polymer material on a substrate can be performed in a chamber capable of maintaining a vacuum during processing (e.g., a physical vapor deposition chamber).

The polymer material can then be heated to a temperature at least as high as a Curie temperature of the polymer material, at block 16. The heating of the polymer material may take place in the same chamber in which the polymer material was originally formed on the substrate. In one embodiment, the chamber is maintained under vacuum throughout formation of the layer of polymer material, heating, alignment, and cooling.

As described above, the polymer material may include PVDF-TrFE. In addition, the heat may be applied directly or indirectly to the polymer material by a heating element and/or by creating ambient heat within the chamber in which the substrate and polymer material are disposed. Moreover, in one embodiment, the heating may be performed between approximately 2 and 600 minutes and at a temperature between approximately 130 degrees and 150 degrees Celsius. The heating may be performed at a temperature and/or for a duration outside of these ranges. However, the heating is preferably performed at a temperature below the melting point of the polymer material.

At block 18, an electric field is applied to the heated polymer material. In one embodiment, the electric field applied to the polymer material may be at least approximately 40 megavolts per meter. Higher strength electric fields may be used for thinner layers of polymer material. As stated above, the electric field may be created by induction and/or with a device such as a capacitor.

Regardless of how the electric field is created, the electric field is applied to align a plurality of the domains of the polymer material in a direction relative to a surface of the substrate. In a preferred embodiment, the direction of alignment is approximately perpendicular to the surface of the substrate. Moreover, the electric field may be applied, for example, until at least approximately 75 percent of the polymer material is in a ferroelectric phase (e.g., β-phase for PVDF-TrFE).

At block 20, the polymer material is cooled while maintaining application of the electric field to the polymer material. As described above, application of the electric field is preferably maintained until the temperature of the polymer material is below the Curie temperature of the polymer material.

Figure 3:
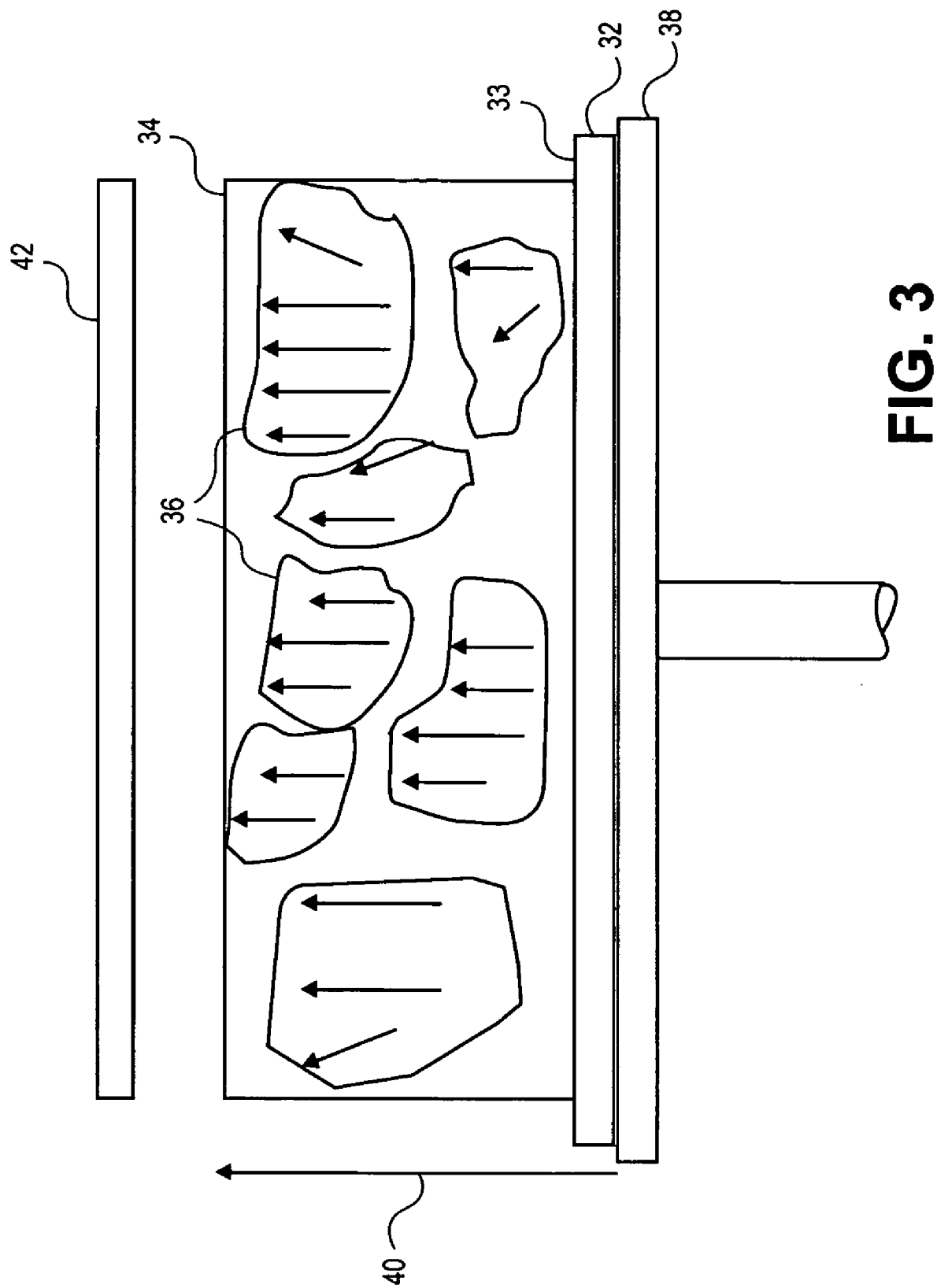
FIG. 3 shows one embodiment of simultaneously heating a polymer material and applying an external electric field to the polymer material.

Although the actual chamber is not shown, FIG. 3 illustrates one embodiment of an internal chamber configuration used to align the domains of a polymer material in a direction relative to a surface of a substrate. Specifically, substrate 32 includes polymer material 34 formed on surface 33 of substrate 32. Polymer material 34 includes domains 36, which have dipoles aligned in the directions indicated by the arrows within each of the respective domains 36.

In the embodiment shown, heated chuck 38 applies heat indirectly to polymer material 34 via substrate 32, which is sitting directly on heated chuck 38. Heated chuck 38 also acts as one plate of a capacitor, the other plate of the capacitor being plate 42, located above polymer material 34.

It should be noted that electric field 40 may be applied to all of polymer material 34 or to only a portion thereof. However, the arrow used to represent electric field 40 only shows the direction in which electric field 40 is applied to influence the alignment of domains 36. Moreover, although electric field 40 is shown in a vertically upward direction, electric field 40 may be applied in any desired direction including a downward direction perpendicular to surface 33 of substrate 32.

Electric field 40 improves the ability to align the dipoles of domains 36 of polymer material 34. Specifically, the arrows within domains 36 indicate that substantially all of the dipoles of domains 36 have been aligned in a direction that is substantially perpendicular to surface 33 of substrate 32. The combination of externally applied electric field 40 and the heating process can overcome steric hindrances and internal electrostatic forces of polymer material 34 so that domains 36 may be aligned to maximize the net remnant polarization of polymer material 34.

Figure 4:
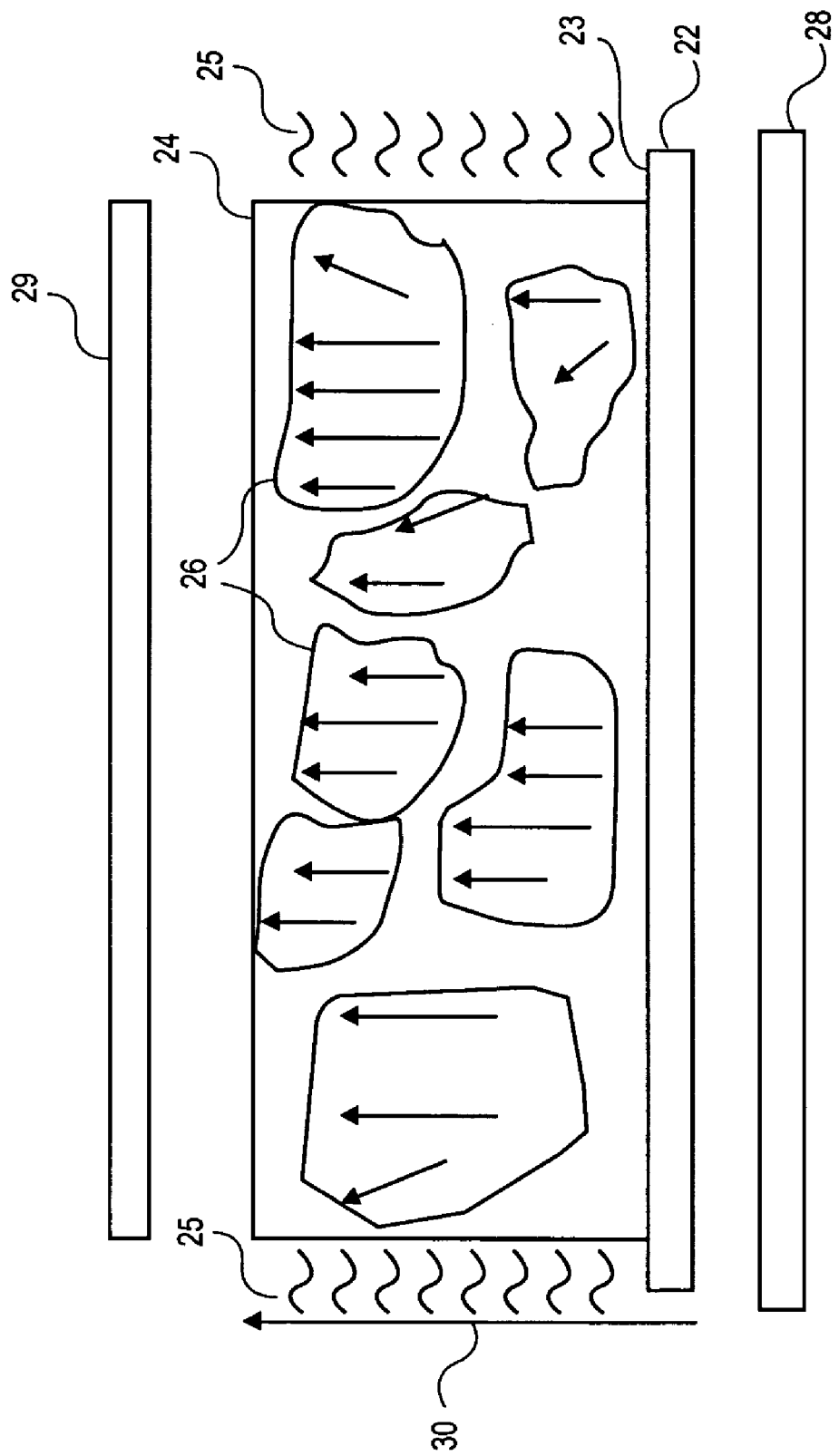
FIG. 4 shows another embodiment of heating a polymer material while simultaneously inducing an electric field in order to align the domains of the polymer material.

FIG. 4 shows an alternative embodiment in which polymer material 24 is formed on surface 23 of substrate 22. Due to heating and aligning as described above, domains 26 of polymer material 24 are aligned in an upward direction substantially perpendicular to surface 23 of substrate 22. However, FIG. 4 shows that ambient heat 25 is used to heat polymer material 24 within a chamber as opposed to directly heating substrate 22 or polymer material 24 by direct contact with a heating element (e.g., a heated chuck).

Moreover, electric field 30 is induced between plate 28 and plate 29. In one embodiment, substrate 22 rests on plate 28 within a chamber. In another embodiment, substrate 22 is supported by another element of the chamber (not shown).

Among other applications, the embodiments disclosed herein may be used to improve the net remnant polarization of polymer material used in memory cells. For example, a flash memory device could include a substrate with a polymer material formed thereon, wherein the polymer material includes a plurality of domains aligned in a direction relative to a surface of the substrate. As stated above, the polymer material could include PVDF-TrFE. The direction of alignment of the domains of the polymer material could be approximately perpendicular to the surface of the substrate, and at least approximately 75 percent of the polymer material could be in a ferroelectric phase. Besides flash memory devices, the materials, devices and methods disclosed herein could be used in other memory applications such as, for example, non-volatile random access memory, static random access memory, transducers, and actuators.

It is to be understood that even though numerous characteristics and advantages of various embodiments have been set forth in the foregoing description, together with details of structure and function of the various embodiments, this disclosure is illustrative only. Changes may be made in detail, especially matters of structure and management of parts, without departing from the scope of the various embodiments as expressed by the broad general meaning of the terms of the appended claims.

We claim:

1. A method comprising:
    heating a ferroelectric polymer comprising a polymer material formed on a substrate to a temperature at least as high as a Curie temperature of the polymer material;
    exposing the polymer material to an external electrical field aligning a plurality of domains of the polymer material in a direction relative to a surface of the substrate; and
    cooling the temperature of the polymer while maintaining the alignment of the domains of the polymer material.

2. The method of claim 1, further comprising:
forming the polymer on the substrate in a chamber prior to heating the polymer.

3. The method of claim 1, wherein the polymer material comprises:
poly(vinylidene fluoride-trifluoroethylene).

4. The method of claim 1, wherein heating the polymer comprises:
at least one of directly applying heat to at least one of the polymer and the substrate with a heating element, and creating ambient heat within a chamber in which the substrate and polymer are disposed.

5. The method of claim 4, wherein heating is performed for between approximately 2 and 600 minutes and at a temperature between approximately 130° and 150° Celsius.

6. The method of claim 1, wherein the electric field comprises:
an electric field of at least approximately 40 megavolts per meter.

7. The method of claim 1, wherein exposing comprises:
at least one of creating an electric field with at least two plates of a capacitor and inducing an electric field.

8. The method of claim 1, wherein the direction of alignment comprises:
a direction approximately perpendicular to the surface of the substrate.

9. The method of claim 1, wherein the alignment is performed until at least approximately 75 percent of the polymer material is in a ferroelectric phase.

10. The method of claim 1, wherein aligning is maintained until the temperature of the polymer material is below the Curie temperature of the polymer material.

11. A method comprising:
heating a ferroelectric polymer comprising a polymer material formed on a substrate to a temperature at least as high as a Curie temperature of the polymer material;
applying an external electric field to the polymer material to align a plurality of domains of the polymer material in a direction relative to a surface of the substrate; and
cooling the temperature of the polymer while maintaining application of the electric field to the polymer material.

12. The method of claim 11, further comprising:
forming the polymer on the substrate in a chamber prior to heating the polymer material.

13. The method of claim 11, wherein the polymer material comprises:
poly(vinylidene fluoride-trifluoroethylene).

14. The method of claim 11, wherein heating the polymer comprises:
at least one of directly applying heat to at least one of the polymer and the substrate with a heating element, and creating ambient heat within a chamber in which the substrate and polymer are disposed.

15. The method of claim 14, wherein heating is performed for between approximately 2 and 600 minutes and at a temperature between approximately 130° and 150° Celsius.

16. The method of claim 11, wherein the electric field comprises:
an electric field of at least approximately 40 megavolts per meter.

17. The method of claim 11, wherein applying the electric field comprises:
at least one of creating an electric field with at least two plates of a capacitor and inducing an electric field.

18. The method of claim 11, wherein the direction of alignment comprises:
a direction approximately perpendicular to the surface of the substrate.

19. The method of claim 11, wherein the electric field is applied until at least approximately 75 percent of the polymer material is in a ferroelectric phase.

20. The method of claim 11, wherein applying is maintained until the temperature of the polymer material is below the Curie temperature of the polymer material.

* * * * *